United States Patent [19]

Bierman et al.

[11] Patent Number: 5,548,541

[45] Date of Patent: Aug. 20, 1996

[54] FINITE IMPULSE RESPONSE FILTER FOR MODULATOR IN DIGITAL DATA TRANSMISSION SYSTEM

[75] Inventors: Raymond E. Bierman, Cerritos; Paul C. Perryman, Laguna Niguel; Jason T. Wright, Anaheim, all of Calif.

[73] Assignee: Interstate Electronics Corporation, Anaheim, Calif.

[21] Appl. No.: 287,208

[22] Filed: Aug. 8, 1994

[51] Int. Cl.[6] .......................... G06F 17/10; H03C 3/00; H04L 27/20
[52] U.S. Cl. .................. 364/724.16; 364/724.01; 375/308; 332/104
[58] Field of Search .................. 364/724.01, 724.16, 364/724.19, 724.2, 728.05, 728.06; 375/296, 308, 232, 350; 332/104

[56] References Cited

U.S. PATENT DOCUMENTS

| | | | |
|---|---|---|---|
| 4,701,875 | 10/1987 | Konishi et al. | 364/728.01 |
| 4,764,940 | 8/1988 | Paneth et al. | 375/308 |
| 4,779,072 | 10/1988 | Van Gestel | 341/59 |
| 4,825,448 | 4/1989 | Critchlow et al. | 375/222 |
| 4,881,240 | 11/1989 | Critchlow et al. | 375/235 |
| 4,893,317 | 1/1990 | Critchlow et al. | 375/344 |
| 4,943,983 | 7/1990 | Critchlow | 375/244 |
| 4,953,184 | 8/1990 | Simone | 375/350 |
| 4,994,802 | 2/1991 | Critchlow et al. | 341/122 |
| 4,996,697 | 2/1991 | Critchlow et al. | 375/351 |
| 5,067,141 | 11/1991 | Critchlow et al. | 375/344 |
| 5,101,418 | 3/1992 | Critchlow et al. | 375/260 |
| 5,105,387 | 4/1992 | Childers et al. | 365/189.03 |
| 5,159,705 | 10/1992 | Critchlow et al. | 455/76 |
| 5,163,120 | 11/1992 | Childers et al. | 395/800 |
| 5,168,507 | 12/1992 | Critchlow et al. | 375/231 |
| 5,177,741 | 1/1993 | Critchlow et al. | 370/110.4 |
| 5,208,837 | 5/1993 | Richey | 375/350 |
| 5,210,836 | 5/1993 | Childers et al. | 395/375 |
| 5,222,189 | 6/1993 | Fielder | 395/2 |
| 5,243,624 | 9/1993 | Paik et al. | 375/232 |
| 5,309,514 | 5/1994 | Johnson et al. | 380/10 |

*Primary Examiner*—Roy N. Envall, Jr.
*Assistant Examiner*—Emmanuel L. Moise
*Attorney, Agent, or Firm*—Calfee Halter & Griswold

[57] ABSTRACT

A finite impulse response (FIR) filter is provided for shaping a one bit serial digital data pulse train in a digital data transmission system. The filter comprises (i) a delay element for sequentially receiving binary data bits in the data pulse train at fixed data cycle intervals and outputting simultaneously in parallel a plurality n of data bits representing a most recent history of the past n data bits received by the delay element during the past n data cycle intervals; (ii) a sampling element for sampling the data pulse train at a rate of m samples per bit, and (iii) a memory device having at least (n 30 m) address lines for providing at least $2^{(n+m)}$ address locations. The n data bits and m samples provide an input to the address lines, the memory device in response providing a specific precomputed and stored output value for each possible combination of address line inputs. The delay element may be implemented as a shift register and the memory device may be implemented as at least one programmable read only memory (PROM) integrated circuit. A counter circuit determines the beginning of each fixed data cycle interval and the rate at which said fixed data cycles occur, which rate is between 500 kilobits (Kbs) and sixteen megabits per second (Mbs). The filter operates as a 319 tap FIR filter at a data input rate of 500 Kbs and as a 19 tap FIR filter at a data input rate of 16 Mbs.

18 Claims, 10 Drawing Sheets

| MODE | DATA CLOCK RATE, TRS (MHz) | FIR FILTER CLOCK RATE, T2FIR_CLK (MHz) | T2FIR_CLK/TRS MULTIPLE |
|---|---|---|---|
| 1 | 500Kbs<TRS≤1Mbs | 16<T2FIR_CLK≤32 | 32 |
| 2 | 1Mbs<TRS≤2Mbs | 16<T2FIR_CLK≤32 | 16 |
| 4 | 2Mbs<TRS≤4Mbs | 16<T2FIR_CLK≤32 | 8 |
| 8 | 4Mbs<TRS≤8Mbs | 16<T2FIR_CLK≤32 | 4 |
| 16 | 8Mbs<TRS≤16Mbs | 16<T2FIR_CLK≤32 | 2 |

FINITE IMPULSE RESPONSE FILTER FOR MODULATOR IN DIGITAL DATA TRANSMISSION SYSTEM

FIELD OF THE INVENTION

The present invention relates generally to digital data transmission systems and more particularly to filtering circuitry for shaping digital data pulse trains in such systems.

BACKGROUND OF THE INVENTION

In digital data transmission systems, filters are often employed to condition signals at various stages during the data transmission process. Systems which include a modem (modulator/demodulator) permit digital data to be transmitted over analog transmission facilities. Typically in a modem environment, the modulator portion of a first modem converts digital data from a computer to an analog signal which may be transmitted over a transmission medium such as a telecommunications line, and the demodulator portion of a second modem converts the transmitted analog signal back into digital form.

Modulators functionally operate to shape a data signal and combine the resulting shaped signal with a sinusoidal carrier frequency to provide a data bearing information signal operating at the carrier frequency. Shaping is performed to provide the data bearing signal appropriate spectral properties which facilitate transmission. The data bearing carrier signal is typically further filtered and sent via the transmission medium to a demodulator on a second modem which reverses the process by recovering the originally transmitted signal from the carrier frequency.

The shaping function of the modulator is typically provided by a finite impulse response (FIR) filter. The manner and extent of shaping is defined by the transfer function provided by the FIR filter.

Typical hardware implementations of FIR filters involve adders and multipliers. Usually, a plurality n of delay elements is provided, off of each of which is a tap. Data signals applied at the taps are individually multiplied, using a multiplier, by coefficients which weight the tapped lines. The resulting weighted data is added at an adder to provide a weighted sum of the previous n values of the data signal. However, the use of adders and multipliers in any FIR implementation results in a large computational burden for the designer, especially if the FIR filter is realized with a large number of taps.

Accordingly, there is a need for an FIR filter which is easily implemented and which eliminates the excessive computational times of known types of FIR filters. It is therefore an object of the present invention to provide a finite impulse response filter having a fast response time for shaping a digital data pulse train in a digital data transmission system. It is a further object of the invention to provide such a filter in a hardware implementation which does not include any adders or multipliers.

SUMMARY

A shaping filter which functions as an FIR filter for a data transmission system is provided. The data transmission system includes a real section (I) and an imaginary section (Q). Each section includes one of the shaping filters, a digital-to-analog (D/A) converter and a second filter (analog low-pass). The input to each of the sections of the data transmission system is a one bit serial digital input signal which is applied to the shaping filter. The outputs of each of the sections is fed to a modulator for mixing the outputs of the respective sections with the output of a carrier signal source.

The digital data input signal which is applied to each of the shaping filters is in the form of a binary data stream which operates at speeds between 500 kilobits per second (Kbs) and 16 megabits per second (Mbs). The data stream is a complex signal which comprises a real data portion and an imaginary data portion. The real data portion is applied to the shaping filter in the real section and the imaginary data portion is applied to the shaping filter in the imaginary section. The shaping filters each function as an FIR filter to provide a linear phase response, based on the most recent history of data input into the filter, which provides the data signal with the proper spectral qualities required for further transmission.

The shaping filters are implemented without using adders or multipliers. The real or in-phase (I) section filter and the imaginary or quadrature (Q) section filter both share a dual counter for controlling the operation of both the I and Q sections. Both the I section filter and the Q section filter comprise a shift register, a pair of programmable read only memories (PROMs), a pair of multiplexing registers, and an output register.

The data received by the shaping filter is input serially into the shift registers. The most recent ten bits of data are output in parallel form to provide a most recent past history of data received. These output lines of the shift registers provide n address lines for the PROMs, in both the I section and Q section filters. The contents of the PROMs are programmed with every possible sum of coefficients which could result from any combination of binary data for the past ten data cycles. Thus the shaping filter output is precomputed for all potential input data combinations and stored in the PROMs. In this manner, the PROMs output the finite response of the filter based on an address which corresponds to the data received by the shift registers during the past ten data cycles.

The dual counter is notified of the start of a data cycle and the incoming data rate. Based on the incoming data rate, for each data cycle the dual counter provides additional address inputs to the PROMs corresponding to particular sampling points for the received data bit. Accordingly, the parallel output of the shift register represents the most recent history of the input data into the shaping filter, and the output of the dual counter represents the position of the current sample with respect to the start of the data cycle.

The number (m) of additional address lines provided by the dual counter to the PROMs depends on the sampling rate of the incoming data signal. At the slowest incoming data rate of 500 Kbs, the dual counter functions as a sampling element to provide 32 samples for each data bit, and thus five additional address lines are provided to satisfy this sampling rate ($\log_2 32=5$). At the fastest incoming data rate of 16 Mbs, the dual counter provides 2 samples for each data bit, and thus only one additional address line is provided to satisfy this sampling rate ($\log_2 2=1$). As a result, each combination of the single shift register and the two PROMS, for both the I and Q section filters, operate as a 319 tap FIR filter at a data input rate of 500 Kbs to 1 Mbs and as a 19 tap FIR filter at a data input rate of 8 Mbs to 16 Mbs.

Because this speed of operation is faster than the speed at which current conventional PROMs operate, two PROMS are required for these rapid address changes, with adjacent samples being managed alternately by the PROMs in a ping-pong method of operation, each PROM operating at between 8 MHz and 16 MHz. The outputs of the PROMs are fed to multiplexing registers, which are alternately clocked at up to 16 MHz to multiplex the PROM outputs into a single 8-bit output word. If faster PROMs should become available, only one PROM would be necessary in both the I section filter and the Q section filter, and the multiplexing registers would not be needed. Instead, the PROM outputs could be directly coupled to the D/A converters. The dual counter would be replaced by a single counter operating at twice the speed of the present dual counter.

The 8-bit word output by the multiplexing registers is applied to an output register which latches the output word out at a clock rate of up to 32 MHz. The output of the output register, which also represents the output of the Shaping filter, is used as an input to the D/A converter in the data transmission system.

DETAILED DESCRIPTION OF THE PREFERRED EMBODIMENT

Figure 1:
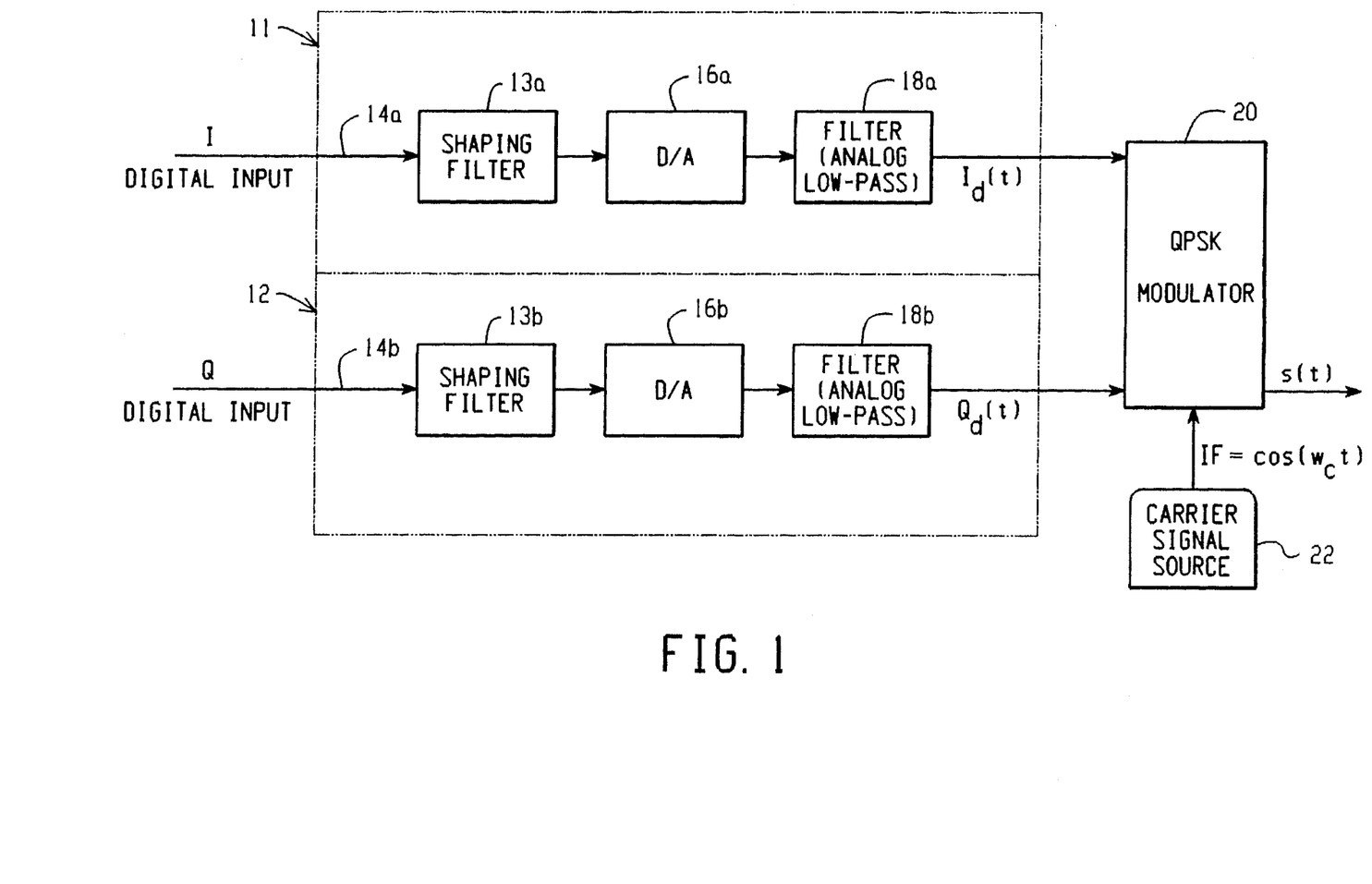
FIG. 1 is a block diagram of a data transmission system into which is incorporated a shaping filter constructed according to the principles of the present invention.

FIG. 1 shows a data transmission system 10, including a real (I) section 11 and an imaginary (Q) section 12, each of which sections having incorporated therein a shaping filter 13 constructed according to the principles of the present invention. Each section includes a shaping filter (13a, 13b), a digital-to-analog (D/A) converter (16a, 16b) and a second filter (analog low-pass) (18a, 18b). The input to each of the sections of the data transmission system is a one bit serial digital input signal which is applied to the shaping filter. The outputs of each of the sections is fed to a QPSK modulator 20 for mixing the outputs of the respective sections with the output of a carrier signal source 22.

The digital data input signal which is applied to each of the shaping filters is in the form of a binary data stream which operates at speeds between 500 kilobits per second (Kbs) and 16 megabits per second (Mbs). The data stream is a complex signal which comprises a real (I) data portion (14a) and an imaginary (Q) data portion (14b). The real data portion is applied to the shaping filter in the real section and the imaginary data portion is applied to the shaping filter in the imaginary section. The shaping filters 13a, 13b each function as an FIR filter to provide a linear phase response, based on the most recent history of data input into the filter.

The linear phase response of the shaping filters 13a, 13b provide the data signal with the proper spectral qualities required for further transmission.

The linear phase response outputs of the shaping filters 13a, 13b are converted to analog signals by the D/A converters 16a, 16b. The outputs of the D/A converters are further filtered by the second filters (analog low-pass) 18a, 18b to provide filtered analog data signals $I_d(t)$ and $Q_d(t)$. The filtered analog data signals $I_d(t)$ and $Q_d(t)$ are used to QPSK modulate the output $\cos(w_c t)$ of the carrier signal source 22, a carrier frequency operating at an intermediate frequency (IF). The modulation function provided by the shaping filters provides a square-root raised cosine spectrum. The QPSK modulator 20 performs the modulation of the carrier frequency by combining the data signals $I_d(t)$ and $Q_d(t)$ with the carrier frequency. The resulting QPSK modulated signal s(t) represents a combined data carrying IF signal. This combined signal s(t) may then be converted to a radio frequency (RF) by known means using an IF/RF converter, and then amplified and broadcast by an antenna to a remotely located demodulator.

Figure 2:
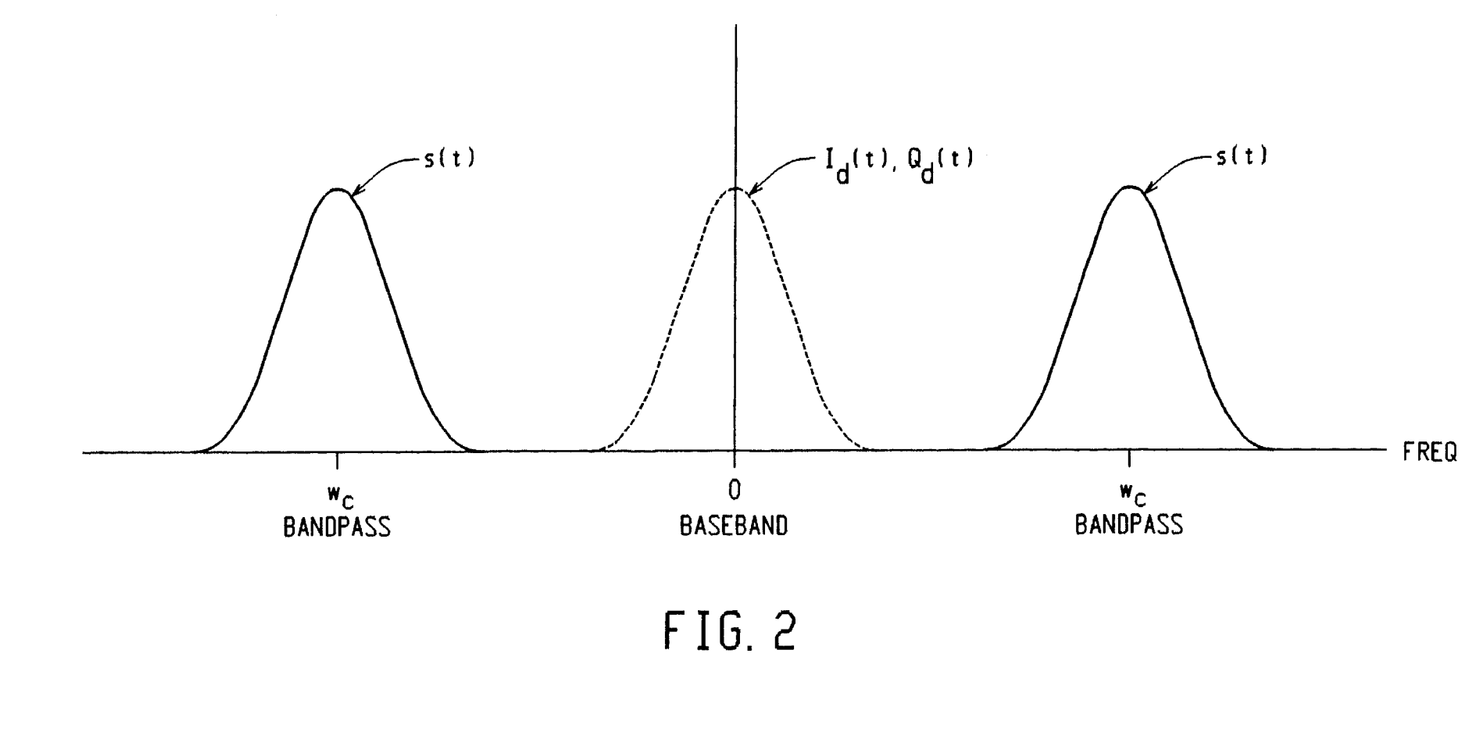
FIG. 2 is a graphical representation of the filtered analog data signals $I_d(t)$ and $Q_d(t)$ and the combined data carrying signal s(t) shown in FIG. 1.

FIG. 2 shows a graphical representation of the filtered analog data signals $I_d(t)$, $Q_d(t)$ and the combined IF data carrying signal s(t). As shown in FIG. 2, the filtered analog data signals $I_d(t)$, $Q_d(t)$ are represented by a spectrum centered around a frequency of zero hertz (Hz) and are referred to as baseband signals. The combined signal s(t) is represented by a spectrum centered about a frequency $w_c$ on either side of the baseband signal d(t) and is referred to as a bandpass signal. Bandpass signals facilitate data transmission to a much greater extent than baseband signals and are therefore preferred in data communications systems.

Figure 3:
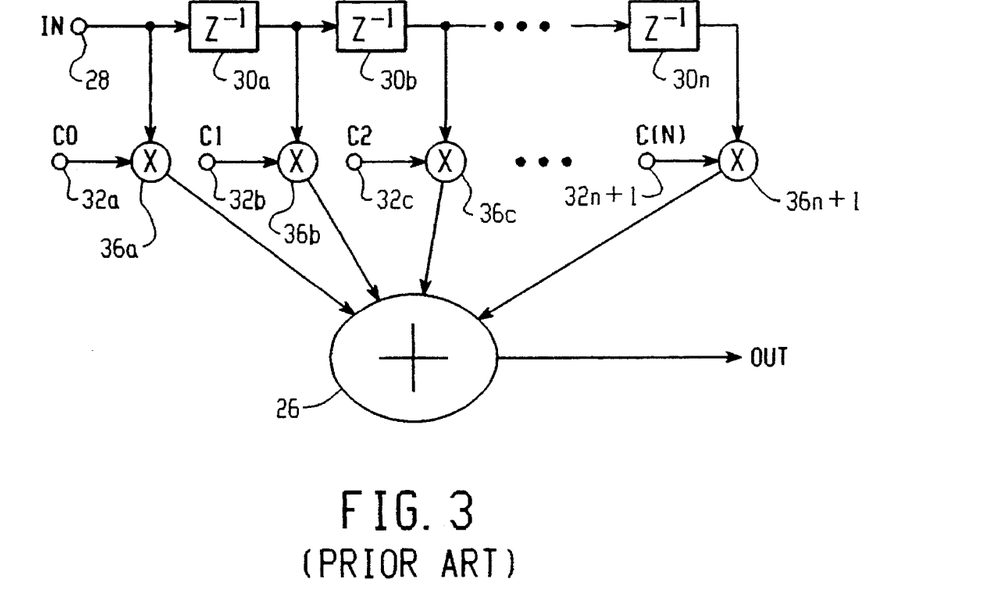
FIG. 3 is a block diagram of a theoretical structure for the shaping filter shown as an element of the system of FIG. 1.

The shaping filters 13a, 13b of the system 10 of FIG. 1 are often referred to as finite impulse response (FIR) filters. FIG. 3 illustrates a theoretical structure of an FIR filter, and is often used to describe such filters. In the theoretical structure illustrated, data (whether real or imaginary) is input at a terminal 28 to a plurality of successive delay elements 30a through 30n. Coefficient data C0 through C(N) is input to each of a plurality of terminals 32a through 32n+1, respectively. Multipliers 36a through 36n+1 obtain the product of the coefficients with the input data, as successively delayed by the delay stages 30a through 30n. The products are summed together in an adder 26 which provides the output of the FIR filter.

Figure 4:
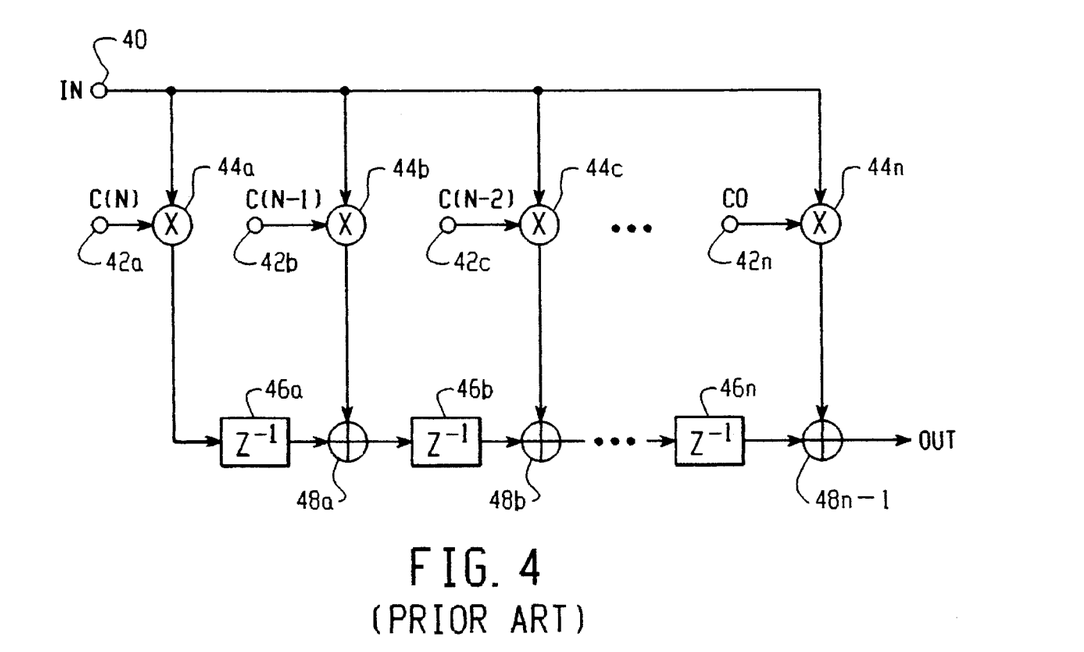
FIG. 4 is a block diagram of a known implementation of the theoretical structure for the shaping filter of FIG. 3.
Figure 5A:
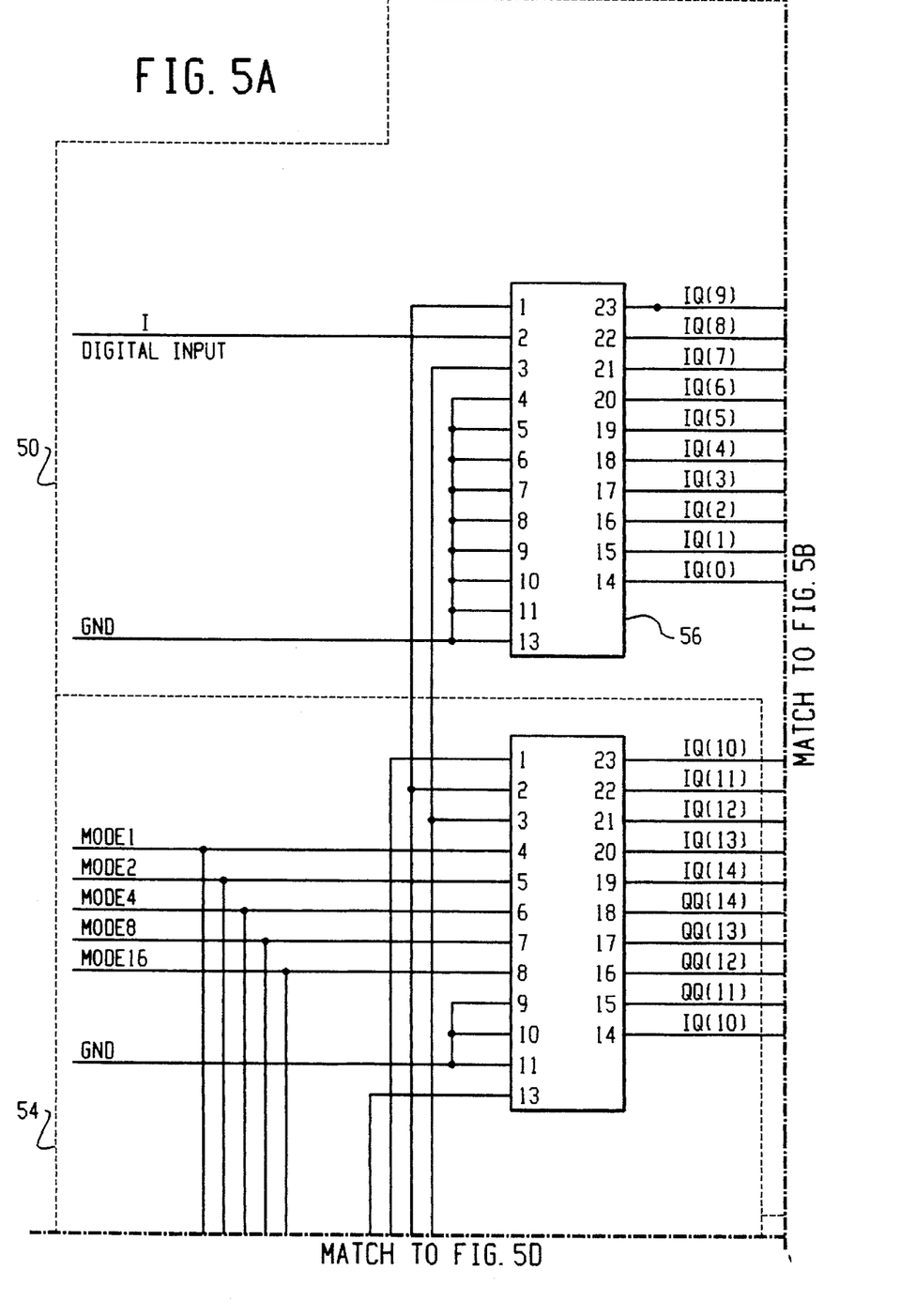
FIG. 5 is a block diagram of the shaping filter of FIG. 1 constructed according to the principles of the present invention.
Figure 5B:
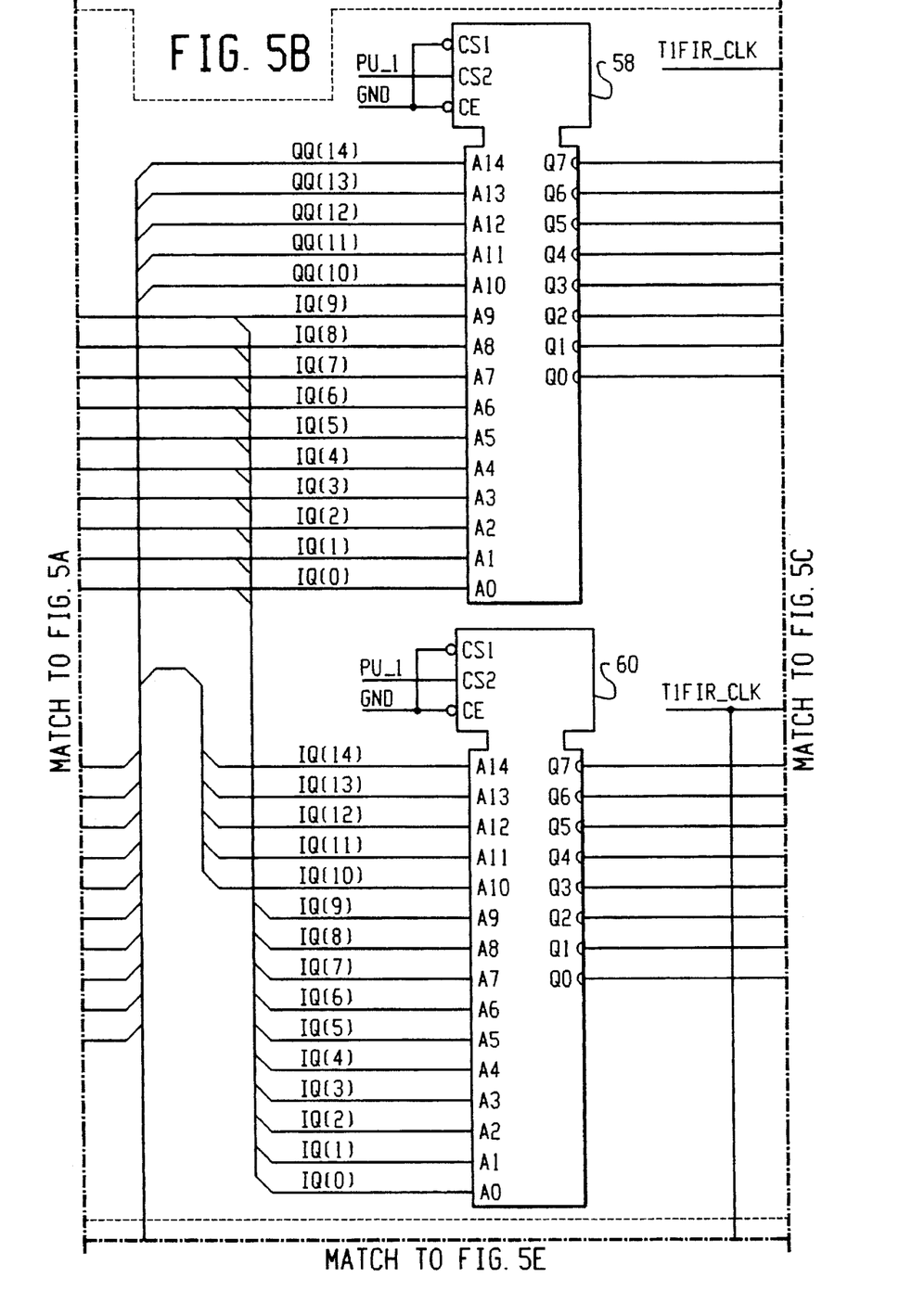
Figure 5C:
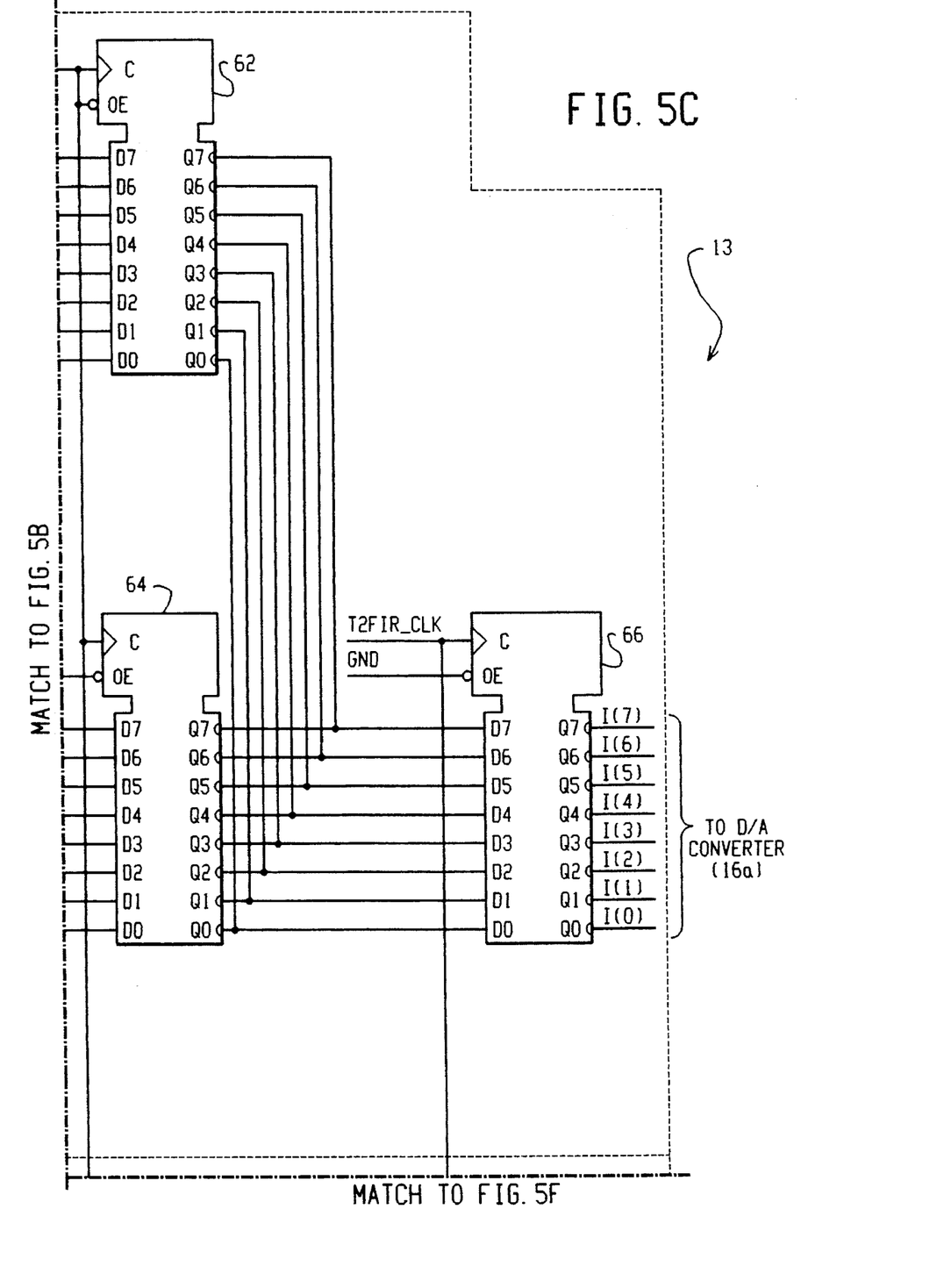
Figure 5D:
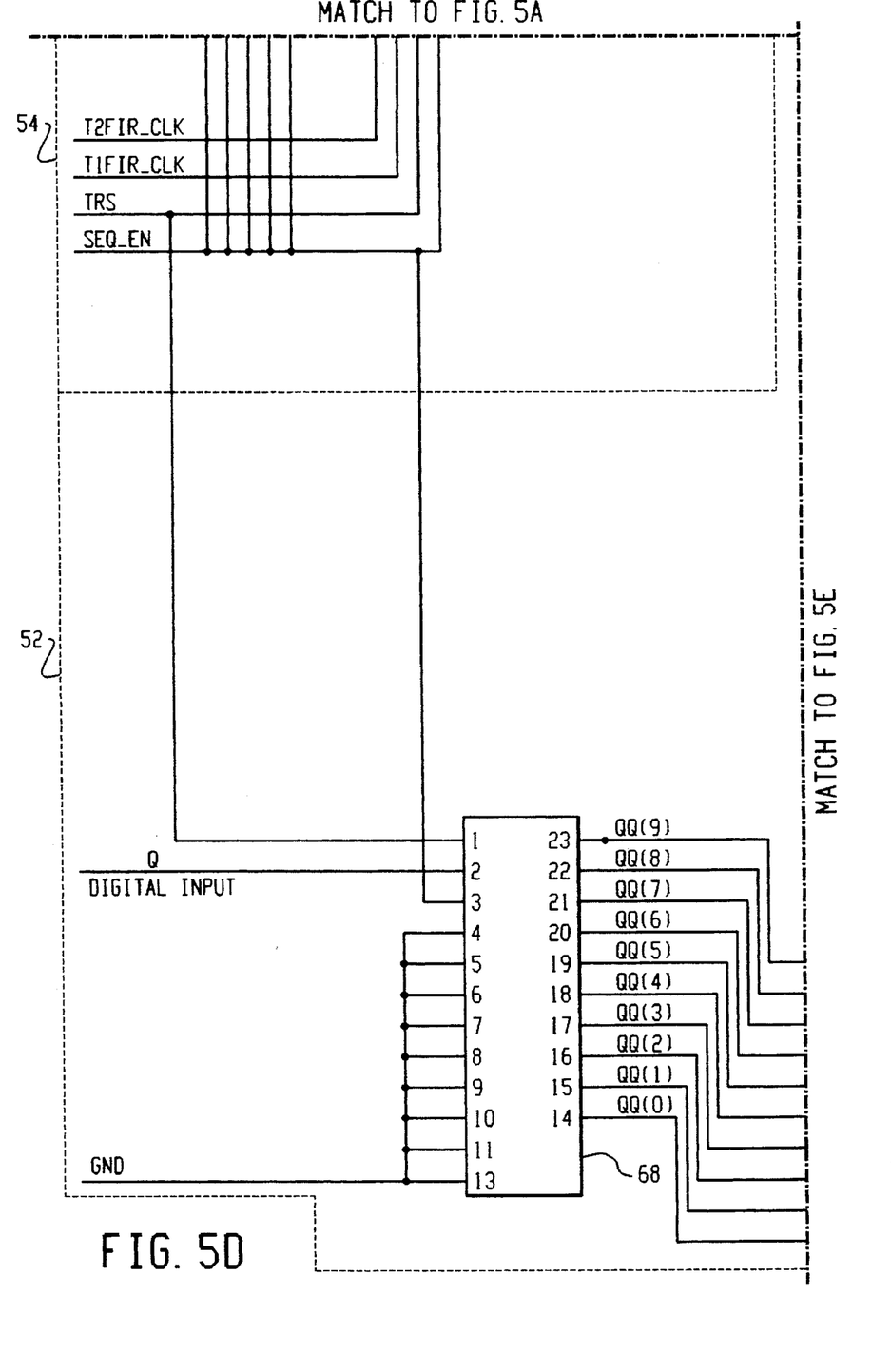
Figure 5E:
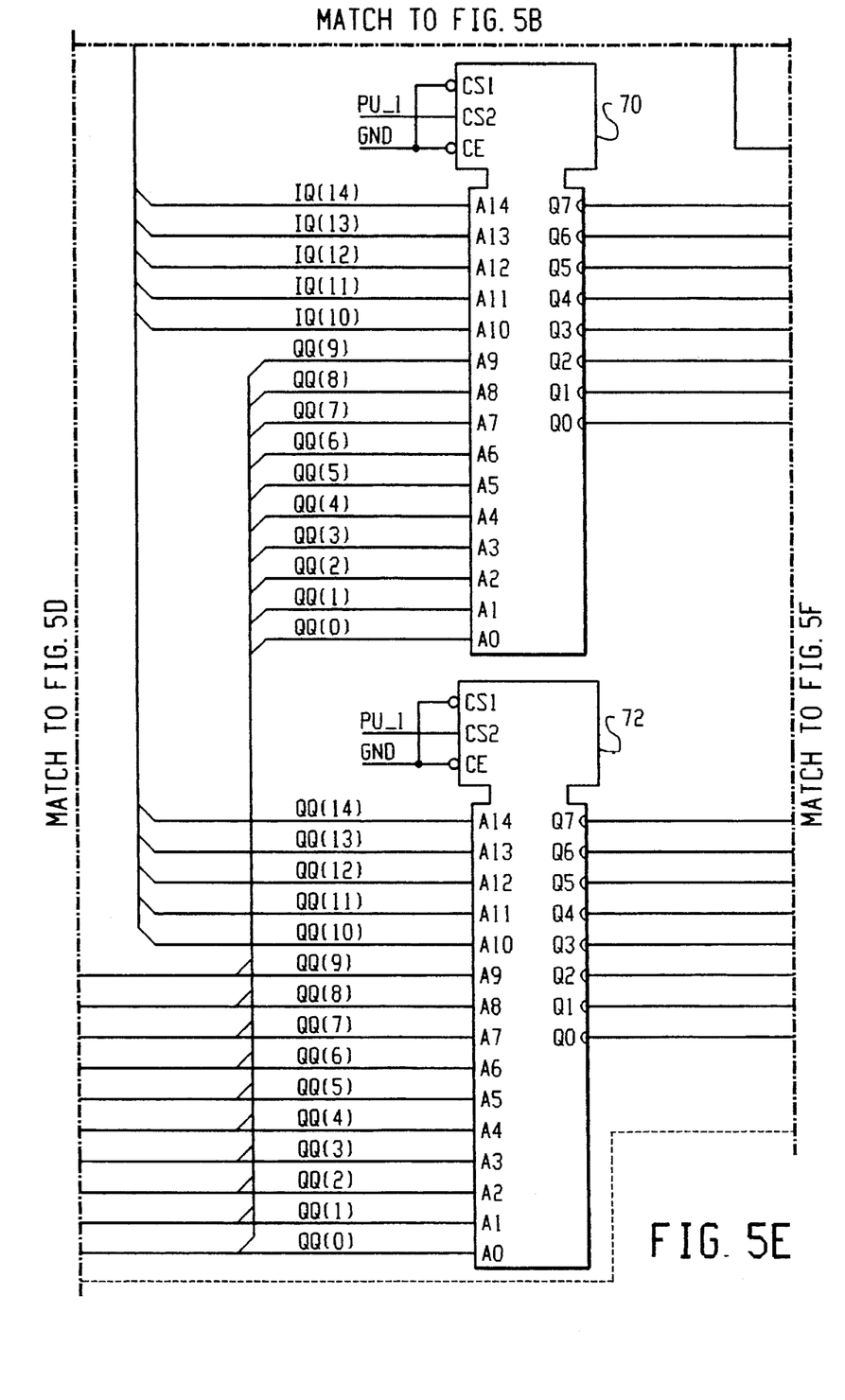
Figure 5F:
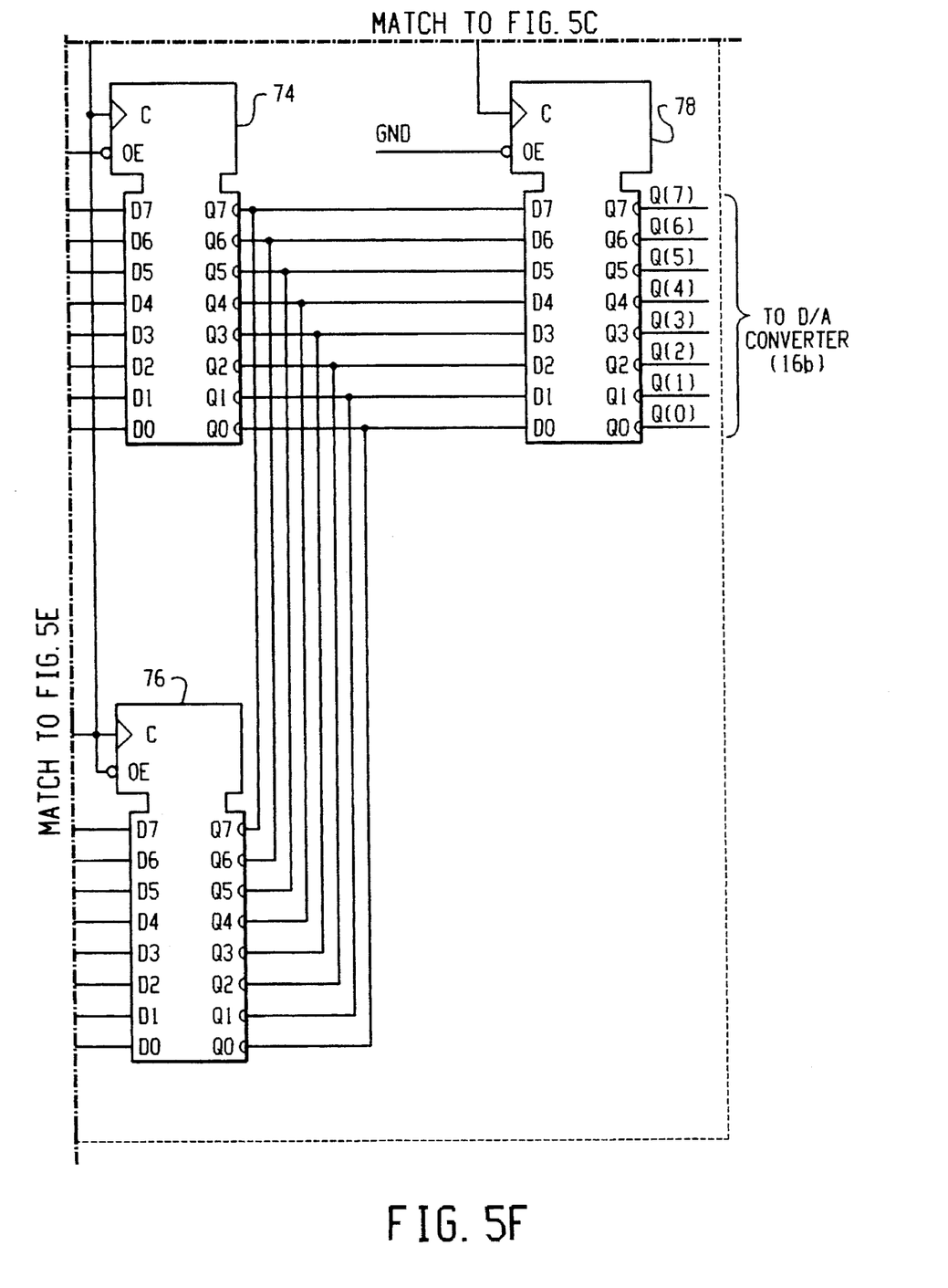

However, the structure of FIG. 3 is seldom used in practice, because of the complexities involved in making an n input adder, such as adder 26, and the necessity of providing n delay element outputs, which would require n output pins in an integrated circuit implementation. In practice, an FIR filter structure as illustrated in FIG. 4 is often used. Data (real or imaginary) is input at a terminal 40, for application to each of a plurality of multipliers 44a through 44n. Coefficients C(N) through C0 are input to each of the multipliers at respective terminals 42a through 42n. The products of the input data and the coefficients are input to a respective delay circuit 46a through 46n via adders 48a through 48n−1, as appropriate.

The present invention provides a novel hardware implementation for the shaping, or FIR, filters 13a and 13b of the system of FIG. 1. The implementation eliminates the use of adders and multipliers as shown in both the theoretical model of an FIR filter of FIG. 3 and the known implementation of an FIR filter of FIG. 4.

As shown in FIG. 5, the shaping filter 13 of the present invention comprises a real or in-phase (I) section 50, an imaginary or quadrature (Q) section 52, and a dual counter 54. The I section 50 comprises a shift register 56, a pair of programmable read only memories (PROMs) 58, 60, a pair of multiplexing registers 62, 64, and an output register 66. The Q section 52 comprises a shift register 68, a pair of PROMs 70, 72, a pair of multiplexing registers 74, 76, and an output register 78. In the preferred embodiment, the dual counter 54 is implemented on a single integrated circuit chip. The types of integrated circuit chips used in the preferred embodiment for components 56–78 are indicated in FIG. 5, although components which perform the same function are contemplated.

The components of the shaping filter 13 are able to function as an FIR filter without the use of the adders or multipliers of the circuits of FIGS. 3 or 4 because the PROMs have contained therein the entire finite set of filter responses for all possible combinations of past data input history. The same program information is stored in each of the PROMs. Real and imaginary data is received by the shift registers 56, 68, respectively, in data cycles of between two microseconds (at a 500 Kbs data rate) and 62 nanoseconds (at a 16 Mbs data rate).

The most recent ten bits of data received serially by the shift registers 56 and 68 are output in parallel form on output lines IQ(0) through IQ(9), and QQ(0) through QQ(9), respectively. IQ(0) and QQ(0) represent the most recently received data bit, IQ(1) and QQ(1) represent the second most recently received data bit, and so forth, such that IQ(9) and QQ(9) represent the data bit which was received by the shift registers 56 and 68 nine data cycles earlier than IQ(0) and QQ(0), respectively. The shift registers, which may be implemented in a programmable array logic (PAL) device, thus function in real time as a delay element to provide a most recent past history of data received.

The output lines IQ(0) through IQ(9) of shift register 56 provide address lines for PROMs 58 and 60, and the output lines QQ(0) through QQ(9) of shift register 68 provide address lines for PROMs 70 and 72. Because the contents of the PROMs are programmed with every possible sum of coefficients which could result from any combination of binary data for the past ten data cycles, the shaping filter output is precomputed for all potential input data combinations. The PROMs thereby output the finite response of the filter 13 based on an address which corresponds to the data received by the shift registers during the past ten data cycles.

Figure 6:
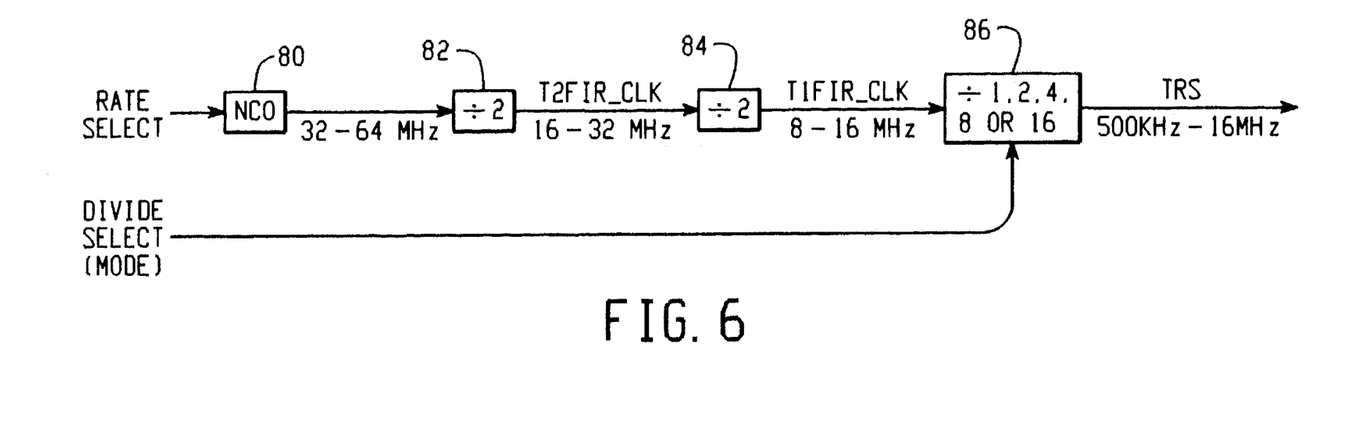
FIG. 6 is a block diagram of a mechanism used to provide various clock signals for the data transmission system of FIG. 1.

The dual counter 54 is used to control both the I section 50 and the Q section 52 of the filter 13. Inputs to the dual counter 54 are the MODE and T2FIR_CLK inputs (explained below), and the T1FIR_CLK, SEQ_EN and TRS inputs. The T1FIR_CLK operates at between 8 MHz and 16 MHz. The SEQ_EN signal is an enable input for the dual counter 54 and both of the shift registers 56, 68. An active TRS (data clock) signal indicates when a new data cycle has begun. FIG. 6 illustrates a mechanism for generating these clocks, comprising a numerically controlled oscillator (NCO) 80, a first fixed divider circuit 82, a second fixed divider circuit 84 and a variable divider circuit 86.

The rate of operation of the shaping filter clock (T2FIR_CLK) is between 16 MHz and 32 MHz depending on the incoming digital data input rate. The span of the digital input data rate is divided into five mutually exclusive parts referred to as MODES. MODE1, MODE2, MODE4, MODE8 and MODE16 are active, respectively, when the incoming data rate is less than or equal to 1 Mbs, greater than 1 Mbs or equal to 2 Mbs, greater than 2 Mbs or equal to 4 Mbs, greater than 4 Mbs or equal to 8 Mbs, and greater than 8 Mbs or equal to 16 Mbs. At the lowest digital data input rate for each mode, the shaping filter clock (T2FIR_CLK) rate is 16 MHz. At the highest digital data input rate for each mode, the shaping filter clock (T2FIR_CLK) rate is 32 MHz.

Figure 7:
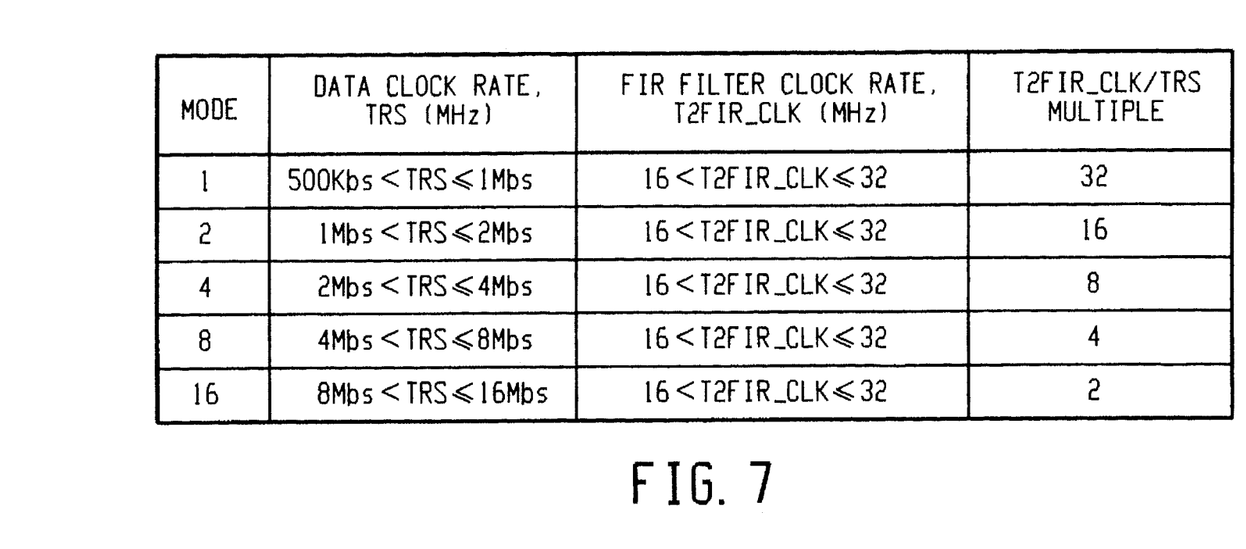
FIG. 7 is a table correlating the digital data input rate and the shaping filter clock rate for various modes of operation of the system of FIG. 1.

Thus, at comparable points for each range, the multiple of the shaping filter clock (T2FIR_CLK) rate relative to the data clock (TRS) rate is 2×, 4×, 8×, 16× and 32× for MODES 16, 8, 4, 2, and 1, respectively. FIG. 7 lists the data clock (TRS) rate range, the shaping filter clock (T2FIR_CLK) rate range, and the multiple of the T2FIR_CLK rate relative to the TRS rate for each mode. Note that for each mode, the multiple is constant.

Referring back to FIG. 5, the dual counter 54 is notified of the beginning of a data cycle (via an active TRS signal) and the incoming data rate (via the appropriate MODE input). During each data cycle, data is read serially into single input pins on the shift registers 56, 68. The shift registers 56, 68 thereby operate unidirectionally to store the binary input data in serial form. The same serially stored data in the shift registers 56, 68 is read out in parallel at the shift register outputs IQ(0) through IQ(9) and QQ(0) through QQ(9).

The shaping filters 13a, 13b operate at the T2FIR_CLK rate of 16 MHz to 32 MHz which is an exact multiple of the incoming data rate. For example, if the incoming data rate is 1 Mbs (MODE1 operation), the dual counter 54 divides each data cycle into 32 time segments so that the data may be sampled 32 times per bit. Similarly, if the incoming data rate is 2 Mbs (MODE2 operation), the dual counter 54 divides each data cycle into 16 time segments so that the data may be sampled 16 times per bit. MODE4, MODE8 and MODE16 operate in a similar manner such that in MODE16, the incoming data rate is 8 Mbs to 16 Mbs and the dual counter 54 breaks up each data cycle into 2 time segments so that the data may be sampled twice per bit. Each combination of the single shift register and the two PROMS for each channel operate as a 319 tap FIR filter at a data input rate of 1 Mbs (32 samples per data bit×10 bit shift register output minus one) and as a 19 tap FIR filter at a data input rate of 16 Mbs (2 samples per data bit×10 bit shift register output minus one).

The I section 50 and the Q section 52 of the filter 13 operate in the same manner to condition the input I data streams and Q data streams, respectively, which together make up the digital inputs 14a, 14b shown as the input to the shaping filters 13a, 13b in FIG. 1. Although the operation of only the I section 50 will be further explained in detail herein, it is assumed that the Q channel operates in an identical manner. The outputs of both the I and Q sections are fed into the D/A converters 16a, 16b shown in FIG. 1, which converts the digital signals to analog signals which may then be combined with the carrier frequency output by the carrier signal source 22.

In order to accommodate the sampling rates which are contemplated by the present invention, and to permit the shaping filter 13 to function as a 19–319 tap FIR filter, more than the ten address lines IQ(0) through IQ(9) are required. Because ten address lines will address only $2^{10}$ PROM locations, the IQ(0) through IQ(9) address lines will only address 1024 (1K) PROM address locations. At the slowest incoming data rate of 500 Kbs, the resulting 319 tap filter must accommodate $2^{15}$ or 32,768 (32K) PROM locations which are addressed by 15 address lines.

Accordingly, in the preferred embodiment of the shaping filter 13 shown in FIG. 5, the PROMs shown are 32K PROMs and five additional address lines IQ(10) through IQ(14) and QQ(10) through QQ(14) are provided to the PROMs 60 and 58, respectively, by the dual counter 54. Thus, the 10 bit word provided by shift register outputs IQ(0) through IQ(9) represent the most recent history of the input data to the shaping filter, and the five bit word provided by the dual counter outputs IQ(10) through IQ(14) represent an integer in the range 0–32 which determines the position of the current sample with respect to the start of the data cycle.

Because the shaping filter circuitry operates at the T2FIR_CLK speed of 16 MHz to 32 MHz, an output must be provided as quickly as every 31 nanoseconds. Even though each of the PROMS 58 and 60 provides the capacity of 32K memory, individually they cannot respond to address changes this quickly. Thus, two PROMS 58 and 60 are required for these rapid address changes, with adjacent samples being managed alternately by the PROMs in a ping-pong method of operation.

Based on the incoming data rate (i.e. the status of the MODE inputs) the dual counter 54 provides address line outputs IQ(10) through IQ(14) as follows. At the MODE1 operation of a 1 Mbs incoming data rate, the dual counter 54 divides the data cycle time of one microsecond into 32 sampling intervals. Because the 1 Mbs data is sampled 32 times during each data cycle, the address lines IQ(10) through IQ(14) will change state at every other one of these 32 intervals (i.e. the "odd intervals"), or once every 62 nanoseconds. PROM 60 will manage the first, third, and every subsequent odd sampling interval up to the thirty-first interval address change, and PROM 58 will manage the second, fourth, and every subsequent even sampling interval up to the thirty-second interval address change. Because each PROM manages only every other address change, it has 62 nanoseconds in which to output a stored sum of coefficients for each address change.

The other MODES of operation are managed similarly. For example, in a MODE16 operation involving an 8 Mbs to 16 Mbs incoming data rate, the dual counter 54 divides the data cycle time into 2 sampling intervals. However, the address lines IQ(10) through IQ(14) will not change state at all because both of the two samples are provided by the dual counter; PROM 60 will manage the first interval address and PROM 58 using QQ(10) through QQ(14) will manage the second interval address. In this manner, the each data bit received by the shift register 54 will be sampled only twice during its data cycle.

Because the PROMs 58 and 60 are provided with a total of fifteen address lines, there is a distinct memory location for each of the possible binary data combinations present on those fifteen address lines. These memory locations are programmed with appropriate coefficient values. Thus, for every address combination provided by the outputs of the shift register 56 (IQ(0)–IQ(9)) and the dual counter 54 (IQ(10)–IQ(14) and QQ(10)–QQ(14)), the PROMs 58 and 60 output a distinct coefficient sum represented as an eight bit word on output lines Q0–Q7.

The outputs of the I-channel PROMs 58, 60 are fed to multiplexing registers 62, 64. These registers are clocked by T1FIR_CLK (16 MHz) and alternately enabled with a complementary signal T1FIR_CLK*. The outputs of the PROMs 58 and 60, which represent alternate sampling intervals, are therefore multiplexed back to their original state by the alternately operating registers 62, 64. The multiplexed output of the registers 62, 64 is then fed to the output register 66 which latches the data out at a T2FIR_ CLK rate of 32 MHz. Thus the output register 66 alternately sees the output of the two multiplexing registers 62 and 64. The output of the output register 66, which also represents the output of the shaping filter 13a, is used as an input to the D/A converter 16a of FIG. 1.

Accordingly, the preferred embodiment of a shaping filter for a digital data transmission system has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

We claim:

1. A finite impulse response filter for shaping a complex signal, in the form of s digital data pulse train having an in-phase channel and a quadrature channel, in a digital data transmission system, comprising:

a delay element for sequentially receiving in-phase and quadrature binary data bits in the data pulse train at fixed data cycle intervals and outputting simultaneously in parallel a plurality n of data bits for each of the in-phase and quadrature channels representing a most recent history of the past n data bits received by said delay element during the past n data cycle intervals;

an element for outputting m sampling bits per each data bit, said sampling bits corresponding to particular sampling points for said n data bits, and a memory device having at least (n+m) address lines for providing at least $2^{(n+m)}$ address locations, said n data bits and m sampling bits providing an input to said address lines, said memory device providing a specific output value for each possible combination of address line inputs.

2. The filter of claim 1, wherein said delay element is a shift register and said memory device is a programmable read only memory (PROM) integrated circuit.

3. The filter of claim 2, wherein said shift register is implemented in a programmable array logic (PAL) device.

4. The filter of claim 2, wherein said fixed data cycles occur at a rate of between 500 kilobits per second (Kbs) and sixteen megabits per second (Mbs).

5. The filter of claim 4, wherein said filter operates as a 319 tap FIR filter at a data input rate of 500 Kbs and as a 19 tap FIR filter at a data input rate of 16 Mbs.

6. The filter of claim 1, wherein said n address lines is ten address lines, said m-bit address is a five bit word, and said memory device specific output value is represented as an eight bit word.

7. The filter of claim 1, wherein said element for outputting m sampling bits operates at up to 16 MHz.

8. The filter of claim 1, wherein said memory device comprises a pair of PROMs which manage address changes effected by said counter circuit alternately in a ping-pong method of operation.

9. The filter of claim 8, further comprising multiplexing registers for alternately storing the specific output values of said pair of PROMs, and an output register for alternately managing outputs of said multiplexing registers.

10. The filter of claim 9, wherein said output register operates at twice the speed of said multiplexing registers.

11. The filter of claim 10, wherein said output register operates at 32 MHz and said multiplexing registers operate at 16 MHz.

12. A method of shaping a complex signal, in the form of a serial digital data pulse train having an in-phase channel and a quadrature channel, in a digital data transmission system, comprising the steps of:

sequentially receiving in-phase and quadrature binary data bits in the data pulse train at fixed data cycle intervals;

outputting simultaneously in parallel a plurality n of data bits for each of the in-phase and quadrature channels representing a most recent history of the past n data bits received during the past n data cycle intervals;

sampling said data bits at a rate of m sampling bits per each data bit, and inputting said n data bits and said m sampling bits into a memory device having at least (n+m) address lines for providing at least $2^{(n+m)}$ address locations; and outputting a specific output value for each possible combination of address line inputs.

13. The method of claim 12, wherein said binary data bits are received by a shift register and said memory device is a programmable read only memory (PROM) integrated circuit.

14. The method of claim 13, wherein said fixed data cycles occur at a rate of between 500 kilobits per second (Kbs) and sixteen megabits per second (Mbs).

15. The method of claim 12, wherein said memory device comprises a pair of PROMs, said method further comprising the step of managing said m-bit address changes with said pair of PROMs alternately in a ping-pong method of operation.

16. The method of claim 15, further comprising the steps of (i) multiplexing the specific output values of said pair of PROMs with a pair of output registers, and (ii) alternately latching outputs of said multiplexing registers with a single output register.

17. The method of claim 16, wherein said output register operates at twice the speed of said multiplexing registers.

18. The method of claim 17, wherein said output register operates at up to 32 MHz and said multiplexing registers operate at up to 16 MHz.

* * * * *

UNITED STATES PATENT AND TRADEMARK OFFICE
CERTIFICATE OF CORRECTION

PATENT NO. : 5,548,541
DATED : August 20, 1996
INVENTOR(S) : Bierman, et al.

It is certified that error appears in the above-indentified patent and that said Letters Patent is hereby corrected as shown below:

col. 8, line 17, after "of", delete "s" and insert --a--.

Signed and Sealed this

Twenty-sixth Day of November 1996

Attest:

BRUCE LEHMAN

*Attesting Officer*  *Commissioner of Patents and Trademarks*